(12) United States Patent
Shiraishi et al.

(10) Patent No.: US 6,519,294 B1
(45) Date of Patent: Feb. 11, 2003

(54) BS DIGITAL BROADCASTING RECEIVER

(75) Inventors: Kenichi Shiraishi, Yokohama (JP); Soichi Shinjo, Machida (JP); Akihiro Horii, Zama (JP)

(73) Assignee: Kabushiki Kaisha Kenwood, Tokyo (JP)

( * ) Notice: Subject to any disclaimer, the term of this patent is extended or adjusted under 35 U.S.C. 154(b) by 0 days.

(21) Appl. No.: 09/743,719

(22) PCT Filed: Jul. 8, 1999

(86) PCT No.: PCT/JP99/03706
§ 371 (c)(1),
(2), (4) Date: Jan. 16, 2001

(87) PCT Pub. No.: WO00/04644
PCT Pub. Date: Jan. 27, 2000

(30) Foreign Application Priority Data

Jul. 17, 1998 (JP) .......................................... 10-218704

(51) Int. Cl.$^7$ .......................... H03K 9/00; H04L 27/06; H04L 27/14; H04L 27/22
(52) U.S. Cl. ...................................... 375/316; 455/3.02
(58) Field of Search ................................. 375/340, 341, 375/316, 346, 285; 370/324, 326; 714/784, 746, 761, 762, 788; 455/3.02

(56) References Cited

U.S. PATENT DOCUMENTS

| | | | | |
|---|---|---|---|---|
| 4,312,070 A | * | 1/1982 | Coombes et al. ........... | 714/762 |
| 5,229,997 A | * | 7/1993 | Hiratara et al. ............. | 370/324 |
| 5,506,903 A | * | 4/1996 | Yamashita .................. | 380/216 |
| 5,870,390 A | * | 2/1999 | Campanella ................ | 370/326 |
| 5,933,462 A | * | 8/1999 | Viterbi et al. ............... | 375/341 |
| 6,118,825 A | * | 9/2000 | Ikeda et al. ................. | 375/259 |

FOREIGN PATENT DOCUMENTS

| | | |
|---|---|---|
| JP | 7-46776 | 5/1995 |
| JP | 99-8412 | 8/1998 |

OTHER PUBLICATIONS

Examiner's Office Letter mailed Mar. 26, 2002 with an English Translation, 4 pages.
Examiner's Office Letter mailed Aug. 6, 2002 with an English Translation, 4 pages.
International Search Report.

* cited by examiner

Primary Examiner—Jean Corrielus
(74) Attorney, Agent, or Firm—Eric J. Robinson; Robinson Intellectual Property Law Office, P.C.

(57) ABSTRACT

A digital broadcasting receiver in which one decoder decodes both Reed-Solomon codes for TMCC and Reed-Solomon codes of an MPEG2-TS packet of a main signal. The received data is divided into a main signal and a TMCC signal. When the separated main signal is subjected to deinterleaving by a deinterleaving circuit (503), the burst symbol signal is eliminated, and the TMCC signal separated subsequent to the main signal in the last frame of a super-frame is added by a selector (509). The received data to which the TMCC signal is added is decoded by a basic Reed-Solomon code decoder (510) so as to carry out the error correction of the main signal and the TMCC signal.

1 Claim, 6 Drawing Sheets

(a)

BS DIGITAL BROADCASTING RECEIVER

This is a 371 of PCT/JP99/03706, filed on Jul. 8, 1999.

TECHNICAL FIELD

The present invention relates to a BS digital broadcasting receiver, and more particularly to a BS digital broadcasting receiver with a Reed-Solomon decoder for decoding Reed-Solomon codes.

BACKGROUND ART

BS digital broadcasting uses a combination of Trellis coding 8PSK (simply called Trellis 8PSK, where applicable) modulation, QPSK modulation and BPSK modulation. In BS digital broadcasting, most fundamental information on main signal transmission necessary for demodulating a transmitted signal is transmitted. For example, a transmission and multiplexing configuration control (TMCC) signal indicating a modulation method, an error correction method or the like is transmitted.

More specifically, Reed-Solomon (RS) codes are adopted for error correction of both the TMCC signal and the MPEG2-transport stream (described as TS) packet of a main signal to realize concatenation coding by using inner codes as convolutional codes and outer codes as Reed-Solomon codes.

Reed-Solomon (RS) codes used are RS (64, 48) and RS (204, 188) of a reduction type from RS (255, 239). The former is adopted for the TMCC signal and the latter is adopted for the MPEG2-TS packet of the main signal. Error correction by Reed-Solomon codes is performed once per one superframe (made of eight frames) for the TMCC signal and 48 times at a maximum per one frame for the MPEG2-TS packet of the main signal.

The BS digital broadcasting method and the structure and technical scheme of a transmission encoding unit are already known (e.g., Official Gazette, Jun. 11, 1998, Extra Edition No. 116).

In such a digital receiver, e.g., a BS digital broadcasting receiver for receiving a BS digital broadcasting program, Reed-Solomon decoding is required to be executed once per one superframe for the TMCC signal and 48 times at a maximum per one frame for the MPEG2-TS of the main signal. Furthermore, the data series of the MPEG2-TS packets of the main signal are generally continuous, whereas the TMCC signal has a data rate different from that of the MPEG2-TS packets. Therefore, error correction by Reed-Solomon codes (also described decoding by Reed-Solomon codes) is generally executed by different circuits for the MPEG2-TS packets and for the TMCC signal. It is not efficient to execute decoding of the Reed-Solomon codes and MPEG2-TS packets of the main signal by using different circuits.

It is an object of the invention to provide a digital receiver such as a BS digital broadcasting receiver, capable of decoding Reed-Solomon codes for both the TMCC signal and the MPEG2-TS packets by using a single decoder.

DISCLOSURE OF THE INVENTION

A digital receiver of this invention receives a data signal of a type that one frame is constituted of a plurality of slots each having a main signal added with first error correction data and a TMCC signal added with second error correction data and a superframe is constituted of a plurality of frames. The digital receiver comprises: means for separating the data signal demodulated into the main signal and the TMCC signal; means for adding the separated TMCC signal to the main signal of a last frame of the superframe; and an error correction decoder for error-correcting the main signal and the TMCC signal by decoding the data signal added with the separated TMCC signal by using predetermined error correction data as the basis of the first and second error correction data.

A BS digital broadcasting receiver of this invention receives a data signal of a type that a slot is constituted of a portion of a TMCC signal, a main signal added with error correction data basing upon a first Reed-Solomon code, and a burst symbol signal, a frame is constituted of a plurality of slots, a superframe is constituted of a plurality of frames, the TMCC signal is constituted of a collection of portions of the TMCC signal of one superframe and error correction data basing upon a second Reed-Solomon code added to the collection of portions of the TMCC signal, and the first and second Reed-Solomon codes are reductions from a same basic Reed-Solomon code. The BS digital broadcasting receiver comprises: separating means for separating the data signal demodulated into the main signal and the TMCC signal; removing means for removing the burst symbol signal when a deinterleaving circuit deinterleaves the separated main signal; adding means for adding the separated TMCC signal after the main signal of a last frame of the superframe; and a Reed-Solomon code decoder for error-correcting the main signal and the TMCC signal by decoding the main signal of a last frame of the superframe added with the separated TMCC signal by using the basic Reed-Solomon code.

In the BS digital broadcasting receiver of the invention, the separating means separates the demodulated reception data into the main signal and TMCC signal. The removing means removes the burst symbol signal when a deinterleaving circuit deinterleaves the separated main signal. The adding means adds the separated TMCC signal after the main signal of a last frame of the superframe. The Reed-Solomon code decoder error-corrects the main signal and the TMCC signal by decoding the main signal of a last frame of the superframe added with the separated TMCC signal by using the basic Reed-Solomon code. Accordingly, only one Reed-Solomon code decoder is sufficient.

EMBODIMENT OF THE INVENTION

A BS digital broadcasting receiver according to an embodiment of the invention will be described.

Figure 1:
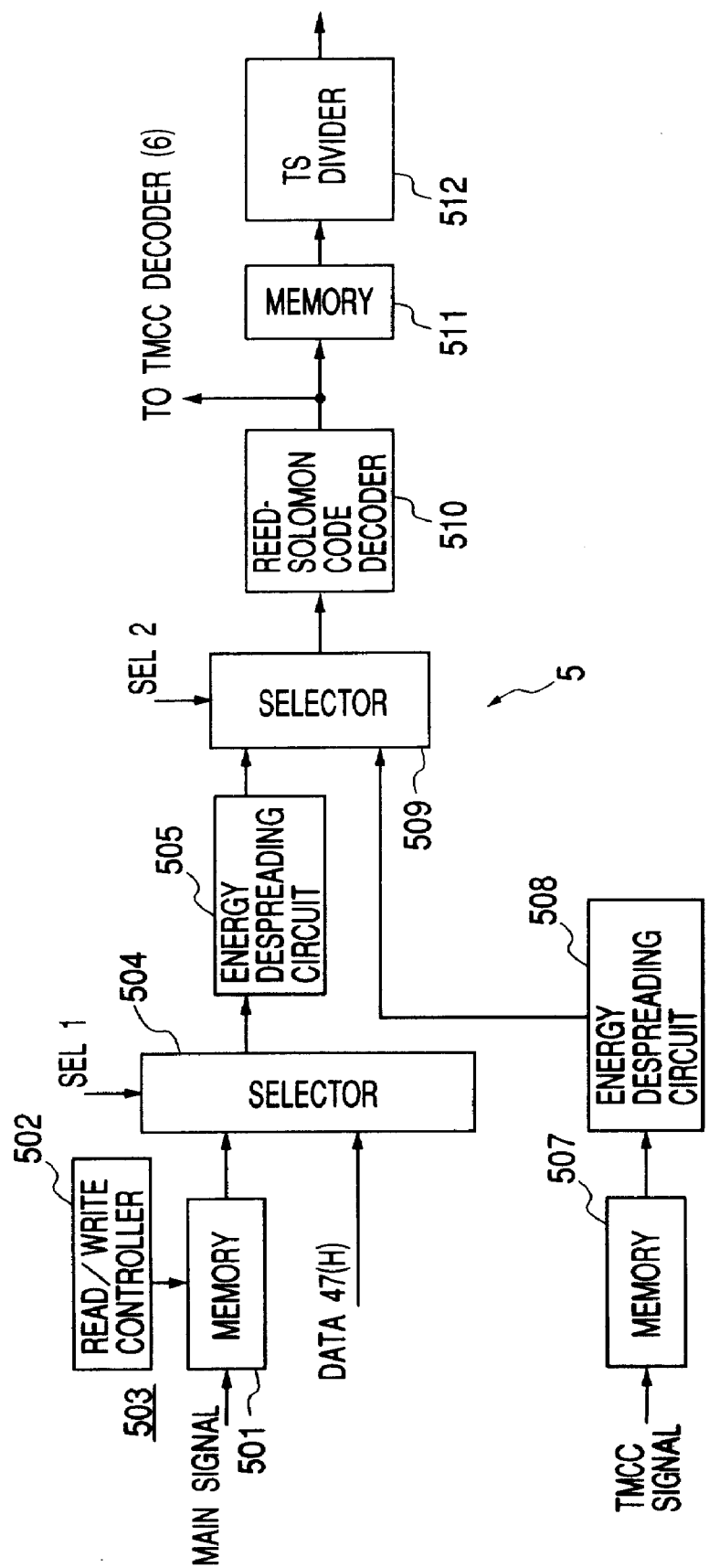
FIG. 1 is a block diagram showing the structure of a Reed-Solomon decoding circuit of a BS digital broadcasting receiver according to an embodiment of the invention.
Figure 2:
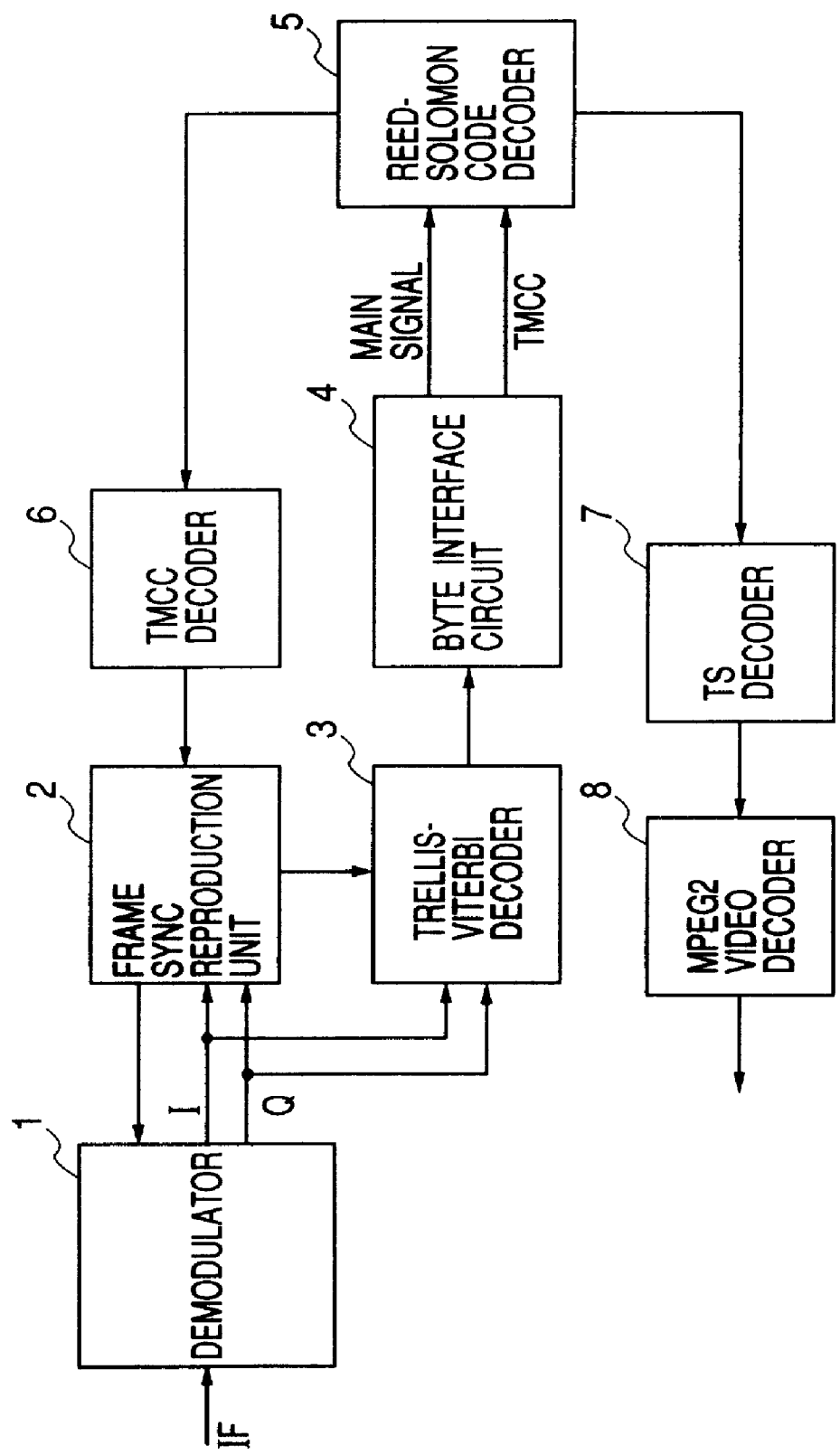
FIG. 2 is a block diagram showing the main structure of the BS digital broadcasting receiver of the embodiment.

FIG. 1 is a block diagram showing the structure of a Reed-Solomon decoding circuit of a BS digital broadcasting receiver according to an embodiment of the invention, and FIG. 2 is a block diagram showing the main structure of the BS digital broadcasting receiver of the embodiment.

Referring to FIG. 2, a signal received and converted into a signal of an intermediate frequency is supplied to a demodulator 1 which demodulates the reception signal. Demodulated signals, e.g., 8-bit baseband demodulated signals I and Q, are supplied to a frame sync reproduction unit 2 which reproduces a frame sync signal and supplies a timing signal or the like to the demodulator 1 to help it demodulate the reception signal.

Signals used by BS digital broadcasting relevant to the present invention will be described. A data bit stream is classified into a slot, a frame and a superframe. The slot is a minimum unit for transmission type selection and TS selection and is constituted of 204 bytes including a MPEG2-TS signal packet (188 bytes) and a Reed-Solomon outer code error detection codes (16 bytes) (hereinafter called an RS parity where applicable).

The frame is a basic transmission unit having 48 slots. Of the sync signals (47(H)) (H represents a hexadecimal notation) of MPEG2 as the start bytes of respective slots of one frame, 12 bytes are substituted for a frame sync signal (2 bytes), a TMCC signal (8 bytes) and a superframe sync signal (2 bytes).

The MPEG2-TS packets of the main signal in one frame are interleaved to avoid burst errors on a transmission line. In order to reliably reproduce the carrier even at a low C/N, a burst symbol signal is inserted into the transmission data format. The burst symbol signal has 4 bytes per slot as it is distributed to the format constituted of MPEG2-TS packets of one frame (48 slots, 204 bytes per slot). A TMCC packet is formed by collecting 8 bytes in start 12 bytes of each frame of one superframe.

This data format will be further detailed. FIGS. 3(a), 3(b), 3(c) and 3(d) are schematic diagrams respectively showing: the data format of an MPEG2-TS packet; the data format of a main signal having a MPEG2-TS packet added with an RS parity (16 bytes) of RS (204, 188); the data format of a frame; and the data format of a superframe.

Figure 3A:
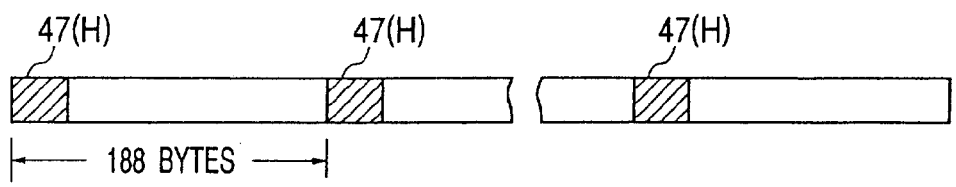
FIGS. 3($a$) to 3($d$) are schematic diagrams showing the data structure used by the BS digital broadcasting receiver of the embodiment.
Figure 3B:
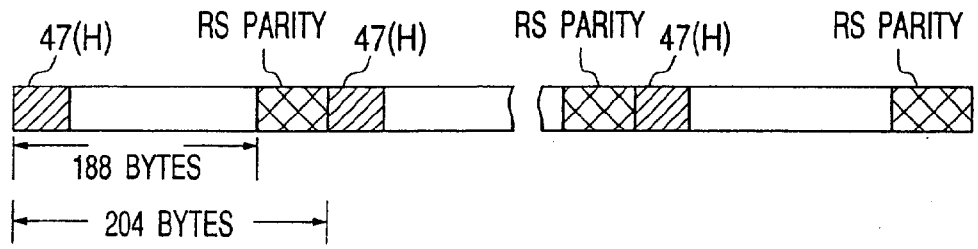
Figure 3C:
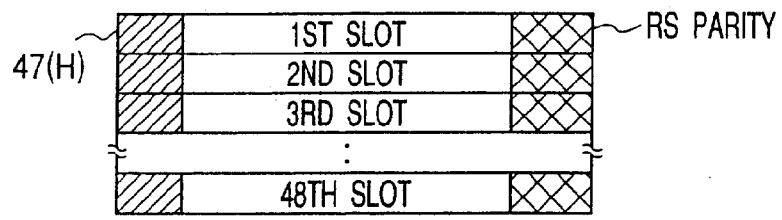
Figure 3D:
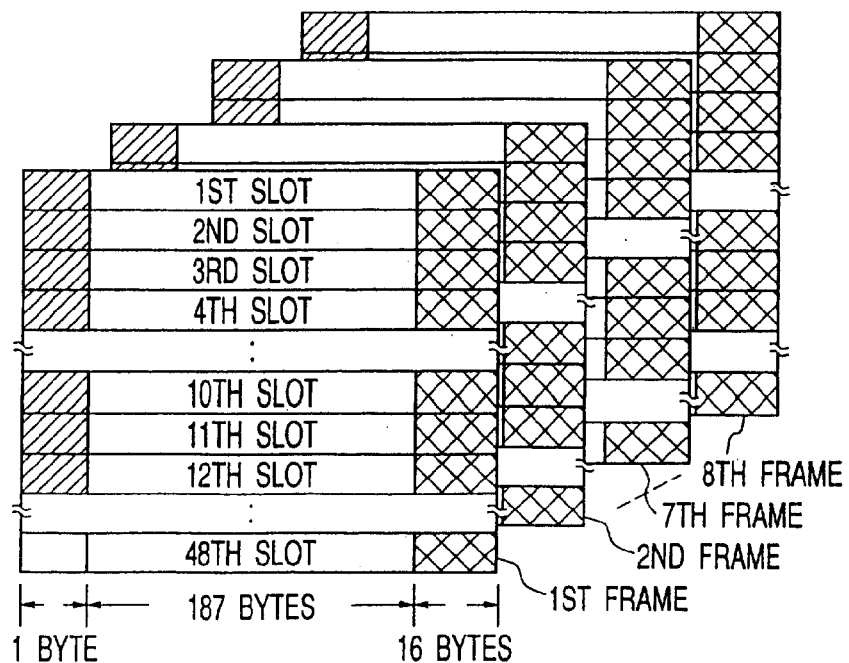

A slashed area in FIGS. 3(a), 3(b) and 3(c) indicates the data 47(H) which is a sync signal of MPEG2-TS. The RS parity is added based upon the data 47(H) and MPEG2-TS packet. In FIG. 3(d), a slashed area indicates the frame sync signal and a crossed area indicates the TMCC signal, these signals being formed by overwriting the data 47(H). An RS parity of RS (64, 48) is added to the TMCC signal.

The demodulated baseband signal has been interleaved on the byte unit basis over each superframe, i.e., at a depth of 8 at each slot. With this interleaving, a block of 8×203 bytes is interleaved and the slots of the same slot number in each frame in the superframe direction are interleaved, respectively on the byte unit basis. The demodulated baseband signals I and Q and frame sync signal are supplied to a Trellis-Viterbi decoder 3 which Trellis-Viterbi decodes them.

Figure 4A:
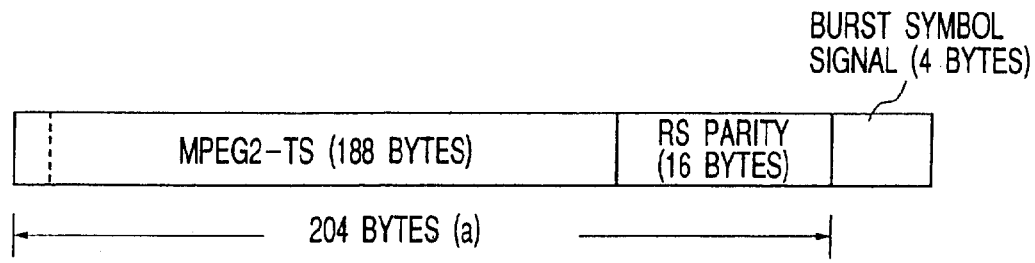
FIGS. 4($a$) and 4($b$) are schematic diagrams showing the data structure of one slot used by the BS digital broadcasting receiver of the embodiment.

FIG. 4(a) is a schematic diagram showing the data format of one slot on the byte unit basis by using a symbol clock as a reference. The start one byte is a frame sync and TMCC signal overwritten on the data 47(H) and indicating the start portion of the TS packet. The end portion is a burst symbol signal (4 bytes). In order to make it easy to understand a correspondence to the contents of FIGS. 6(a) to 6(d), a portion of 204 bytes excepting the burst symbol signal is indicated by a reference character (a).

Figure 4B:
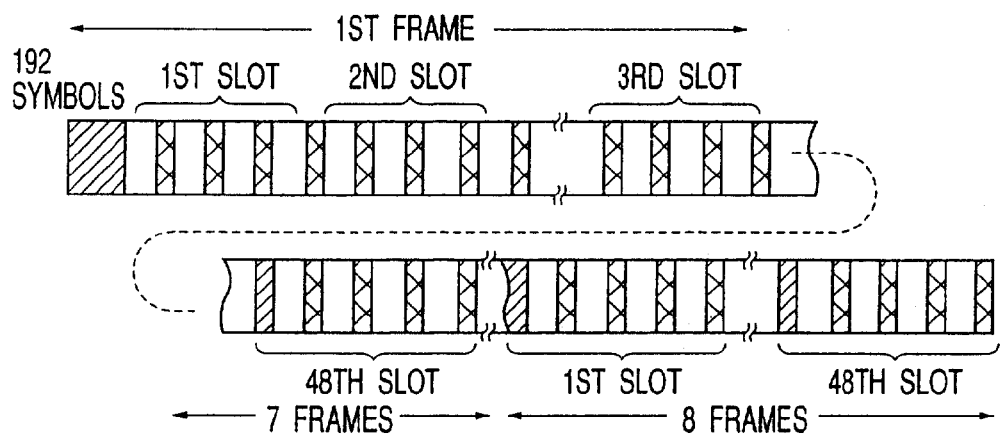

FIG. 4(b) shows the data structure of one superframe before Trellis-Viterbi decoding by using the symbol clock as a reference. In FIG. 4(b), the superframe is constituted of the sync signal of 192 symbols (TMCC signal), main signals of first slots of the first to eighth frames interleaved, a burst symbol signal, . . . , main signals of second slots of the first to eighth frames interleaved, a burst symbol signal, . . . , main signals of forty eighth slots of the first to eighth frames interleaved, a burst symbol signal, . . . .A slashed area in FIG. 4(a) indicates the frame sync signal and TMCC signal, and a crossed area indicates the burst symbol signal.

Figure 5A:
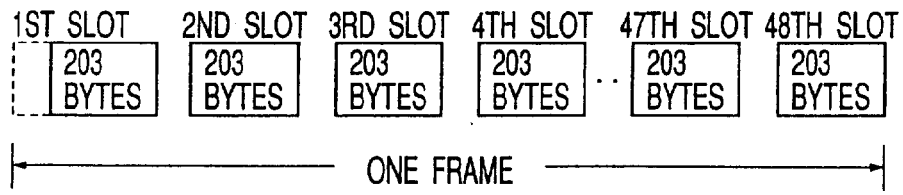
FIGS. 5($a$) and 5($b$) are schematic diagrams illustrating a data process to be executed by the BS digital broadcasting receiver of the embodiment.
Figure 5B:

Data Trellis-Viterbi decoded by the Trellis-Viterbi decoder 3 is supplied to a byte interface circuit 4 including a separating means. The data is changed to data of a byte unit and separated into the TMCC signal and main signal. FIGS. 5(a) and 5(b) show data of one frame of the TMCC signal and the main signal changed to the byte unit and separated by the byte interface circuit 4.

FIG. 5(a) shows the main signal separated by the byte interface circuit 4 before deinterleaving, the TMCC signal being indicated by a broken line in FIG. 5(a). The separated main signal before deinterleaving is constituted of data of 203 bytes of the first slot (excepting the start byte, this meaning of the term of 203 bytes is applied also in the following description), a blank period of 4 bytes for the burst symbol signal, data of 203 bytes of the second slot, a blank period of 4 bytes for the burst symbol signal, . . . , data of 203 bytes of the forty eighth slot, and a blank period of 4 bytes for the burst symbol signal.

FIG. 5(b) shows the TMCC signal separated by the byte interface circuit 4. The TMCC signal becomes significant only when it is formed by collecting each TMCC signal portion from one superframe. In each frame, the TMCC signal includes the frame sync signal of 2 bytes, TMCC data of 8 bytes, and the frame sync signal of 2 bytes. In each superframe, the TMCC signal includes TMCC data of 64 bytes (8 bytes×8 frames).

The TMCC signal and main signal separated by the byte interface circuit 4 are supplied to a Reed-Solomon code decoder circuit 5 to Reed-Solomon decode them.

The Reed-Solomon decode circuit 5 has the structure shown in FIG. 1. A deinterleaving circuit 503 functioning also as a removing means has a memory 501 for storing and deinterleaving the main signal changed to the byte unit, and a read/write controller 502 for controlling data read/write of the memory 501. The main signals shown in FIG. 5(a) separated by the byte interface circuit 4 are sequentially supplied to the deinterleaving circuit 503 and written in the memory 501 by the amount corresponding to one superframe. In this data write, the burst symbol signal in each slot is skipped and removed.

After the main signals of one superframe are written in the memory 501, the interleaved main signals of one frame are deinterleaved by changing the order of read addresses. The slots constituting one frame are sequentially read in such a manner that after one byte read period after the main signals of a preceding frame are read, the main signals of the next slot are read. In this manner, the main signals of one super frame are deinterleaved. Therefore, the burst symbol signals of 192 bytes (=burst symbol signal of 4 bytes×48 slots) in each frame are removed before the main signals are written in the memory 501. A blank period of one byte is formed between each slot and the burst symbol signals of 192 bytes in each frame are removed. The burst symbol signal may be removed when the main signals are read from the memory 501, instead of when the main signals are written therein.

Figure 6A:
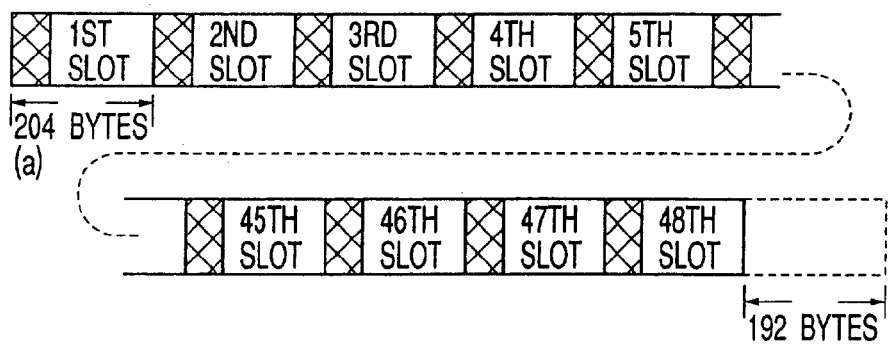
FIGS. 6($a$) to 6($d$) are schematic diagrams illustrating a data process to be executed by the BS digital broadcasting receiver of the embodiment.
Figure 6B:
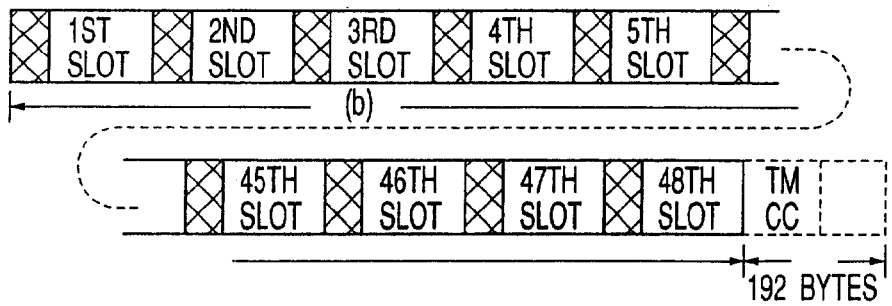
Figure 6C:
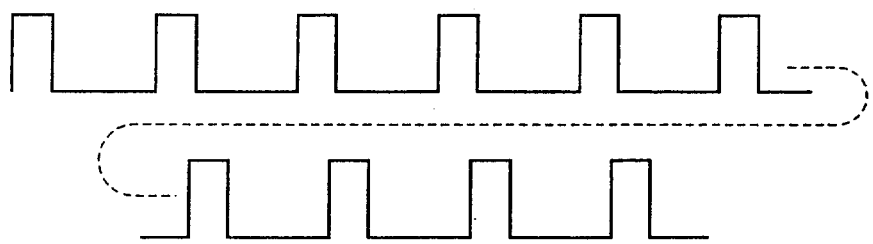
Figure 6D:
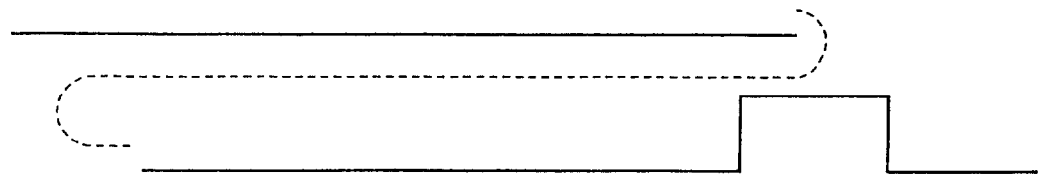

The deinterleaved main signals are shown in the schematic diagram of FIGS. 6(a) to 6(d). FIGS. 6(a) and 6(b) show the deinterleaved main signals output from the deinterleaving circuit 503.

FIG. 6(a) shows the main signals of the first to seventh frames, and FIG. 6(b) shows the main signals of the eighth frame. In order to make it easy to understand a correspondence to the contents of FIG. 4(a), a start portion of 204 bytes in FIG. 6(a) is indicated by a reference character (a), as a representative one. Also, one frame is indicated by a reference character (b) in FIG. 6(b) in order to facilitate understanding the contents of FIGS. 7(a) to 7(c).

The data 47(H) generated to indicate the sync signal of the MPEG2-TS packet and the main signals read from the deinterleaving circuit 503 are supplied to a selector 504. Under the select control by a select signal SEL1 shown in FIG. 6(c) and supplied to the selector 504, the selector 504 inserts the data 47(H) at the position immediately before the deinterleaved main signal of 203 bytes in each slot, i.e., in the blank period indicated by a crossed area in FIGS. 6(a) and 6(b).

As shown in FIGS. 6(a) and 6(b), the selector 504 outputs data of 9792 bytes (=(203 bytes+1 byte (data 47(H)))×48 slots) for each frame, leaving a blank of 192 bytes (=4 bytes (burst symbol signal)×48 shots) for each frame.

The data output from the selector 504 is supplied to an energy despreading circuit 505 to dispread the data in order to compensate for the energy spreading made when data was transmitted from the satellite.

The TMCC signal in the byte unit separated by the byte interface circuit 4 is supplied to a memory 507 and stored therein by an amount corresponding to one superframe. Then, the TMCC signal is read from the memory 507. Since the TMCC signal of only one packet exists in one superframe, the TMCC signal of each frame is stored in the memory 507 to complete one TMCC packet when the TMCC signal of the last frame of the superframe is stored in the memory 507. The completed TMCC packet is read from the memory 507. The TMCC packet read from the memory 507 is supplied to an energy dispreading circuit 508 to dispread the packet to compensate for the energy spreading made when the packet was transmitted from the satellite.

The data output from the energy dispreading circuits 505 and 508 is supplied to a selector 509 serving as an adding means. Under the select control by a select signal SEL2 shown in FIG. 6(d) and supplied to the selector 509, the selector 509 first selects the output from the energy dispreading circuit 505 of one superframe and then selects the output from the energy dispreading circuit 508.

More specifically, as indicated by a broken line in FIG. 6(b), the selector 509 additionally inserts the TMCC signal of one superframe after the main signals of the last frame of the superframe. The TMCC signal of one superframe includes, as described earlier, TMCC data of 64 bytes (=8 bytes×8 frames) which can be inserted in the blank period of the eighth frame of 192 bytes, still leaving a capacity margin.

Figure 7A:
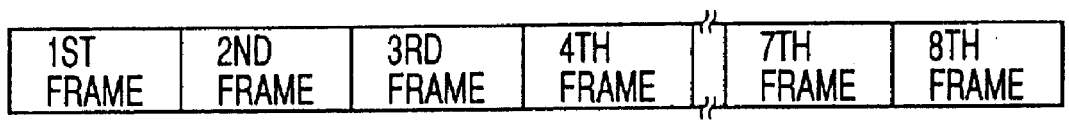
FIGS. 7($a$) to 7($c$) are schematic diagrams illustrating a data process to be executed by the BS digital broadcasting receiver of the embodiment.

The data of one superframe before deinterleaving is shown in the schematic diagram of FIG. 7(a) which corresponds to FIG. 4(b). The data of one superframe output from the selector 509 is shown in the schematic diagram of FIG. 7(b) which corresponds to FIG. 4(a) and FIG. 4(b) with the added TMCC signal (the TMCC signal of one superframe is called the TMCC packet where appropriate). The reference character (b) shown in FIG. 7(b) indicates the correspondence to the contents of FIG. 6(b).

The data output from the selector 509 is supplied to a Reed-Solomon code decoder 510 to be decoded and error-corrected. In this case, Reed-Solomon codes of RS (64, 48) and RS (204, 188) of a reduction type from RS (255, 239) are used both for the MPEG2-TS packet of the main signal and for the TMCC signal. Therefore, 51 bytes of (00H) are added before the MPEG2-TS packet of the main signal, whereas 191 bytes of (00H) are added to the TMCC signal. In this manner, one Reed-Solomon code decoder 510 can decode and error-correct both the TMCC signal and MPEG2-TS packet.

An output from the Reed-Solomon code decoder 510, i.e., an error-corrected output, is supplied to a TMCC decoder 6 and stored in a buffer memory 511. Upon reception of the output from the Reed-Solomon code decoder 510, the TMCC decoder 6 decodes the TMCC packet and supplies the decoded signal to the frame sync reproduction unit 2 for the demodulation at the demodulator 1.

When the main signal is deinterleaved by the deinterleaving circuit 503, the position of the slot shifts (advances) relative to the transmission timing. Therefore, data in the buffer memory 511 is read in a manner so that the original timing of the slot of each frame can be recovered.

Figure 7B:
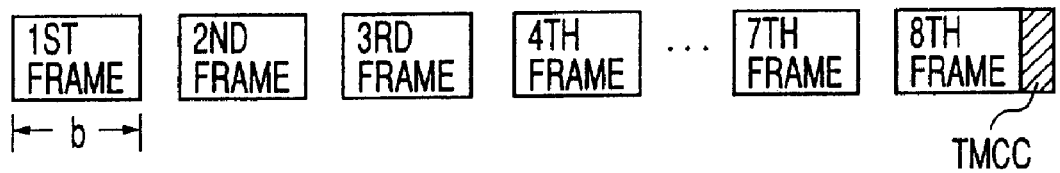
Figure 7C:
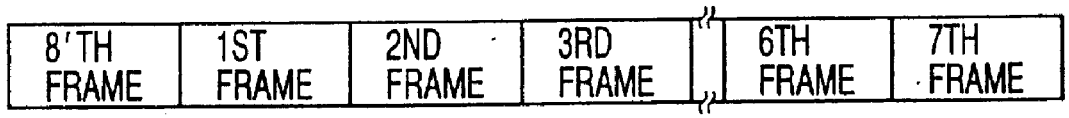

Data before and after deinterleaving is shown in FIGS. 7(a) and 7(b). FIG. 7(a) is a schematic diagram showing data of one superframe before the deinterleaving, and FIG. 7(b) is a schematic diagram showing data of one superframe after the deinterleaving. One frame corresponds to one frame indicated by the reference character (b) in FIGS. 6(a) and 6(b). FIG. 7(c) is a schematic diagram showing data of one superframe read from the buffer memory 511.

Data read from the buffer memory 511 is synchronized with a program clock reference of the MPEG2-TS packet so that the MPEG2-TS packet can be decoded. The data read from the buffer memory 511 is supplied to a transport stream (TS) divider 512 to divide it into streams which are decoded by a TS decoder 7. This decoded data is supplied to an MPEG2 video decoder 8 which expands the decoded data compressed by MPEG2 and outputs the image data to a receiver to display an image.

Industrial Applicability

As described so far, the BS digital broadcasting receiver of this invention uses only one Reed-Solomon decoder although it has been conventionally necessary to use two decoders. An area necessary for an integrated circuit for the receiver can therefore be reduced.

Although the structure and operation of the principle of the invention has been described by taking as an example a BS digital broadcasting receiver, the invention is not limited only to a BS digital broadcasting receiver. It should be construed that the invention is applicable to general digital receivers having a similar function without departing from the principle of the invention. The technical field of this invention is limited only by the description given in the appended claims.

What is claimed is:
1. A BS digital broadcasting receiver for receiving a data signal consisting of a plurality of superframes each consisting of a plurality of frames each consisting of a plurality of slots each of which comprises a portion of a transmission and multiplexing configuration control (TMCC) signal, a main signal added with error correction data based upon a first Reed-Solomon code, and a burst symbol signal, the TMCC signal comprising a set of portions of the TMCC signal over one superframe with error correction data based upon a second Reed-Solomon code being added, both the first and second Reed-Solomon codes being reduction versions of a basic Reed-Solomon code, the BS digital broadcasting receiver comprising:

demodulating means for demodulating the data signal;

separating means for separating the data signal demodulated by the demodulating means into the main signal and the TMCC signal;

removing means for removing the burst symbol signal when deinterleaving the main signal separated by the separating means;

adding means for adding the TMCC signal separated by the separating means after the main signal of a last frame in the superframe; and a Reed-Solomon code decoder for decoding the data signal with the separated TMCC signal added by the adding means after the main signal of a last frame in the superframe by using the basic Reed-Solomon code to error-correct the main signal and the TMCC signal.

* * * * *